United States Patent
Arie et al.

(10) Patent No.: US 8,033,842 B2
(45) Date of Patent: Oct. 11, 2011

(54) APPARATUS AND METHOD FOR MOUNTING AUDIO-VISUAL COMPONENTS

(75) Inventors: Isamu Arie, Santa Monica, CA (US); Fumiya Matsuoka, Torrance, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1029 days.

(21) Appl. No.: 11/557,925

(22) Filed: Nov. 8, 2006

(65) Prior Publication Data

US 2008/0106885 A1    May 8, 2008

(51) Int. Cl.
*H01R 25/14* (2006.01)
(52) U.S. Cl. ........................................... 439/120
(58) Field of Classification Search ............. 439/120, 439/426, 113, 122, 118, 216, 211; 174/36, 174/507; 381/386, 87, 82; 181/144, 145; 307/112, 106

See application file for complete search history.

(56) References Cited

U.S. PATENT DOCUMENTS

| | | | |
|---|---|---|---|
| 5,000,286 A | | 3/1991 | Crawford et al. |
| 5,342,204 A | * | 8/1994 | Och ................... 439/39 |
| 5,444,194 A | | 8/1995 | Reinke |
| D367,476 S | | 2/1996 | Martin |
| 5,603,621 A | * | 2/1997 | Elmouchi ............ 439/120 |
| 5,812,796 A | | 9/1998 | Broedner et al. |
| 5,915,980 A | * | 6/1999 | Baldock ............. 439/120 |
| 5,946,401 A | * | 8/1999 | Ferren ................ 381/82 |
| 6,465,516 B1 | * | 10/2002 | Kaesemeyer ........... 514/548 |
| D467,897 S | | 12/2002 | Lin |
| D477,829 S | | 7/2003 | Hussaini et al. |
| D477,830 S | | 7/2003 | Hussaini et al. |
| 6,587,739 B1 | | 7/2003 | Abrams et al. |
| 6,703,962 B1 | | 3/2004 | Marics et al. |
| 6,797,885 B2 | | 9/2004 | Magyar et al. |
| 6,923,684 B2 | | 8/2005 | Strayer |
| 7,095,867 B2 | | 8/2006 | Schul et al. |
| 7,130,432 B2 | * | 10/2006 | Lee et al. ............... 381/87 |
| 7,140,584 B2 | * | 11/2006 | Bourque et al. ......... 248/274.1 |
| D550,650 S | | 9/2007 | Patel et al. |
| D561,175 S | | 2/2008 | Zhang |
| 7,679,524 B2 | | 3/2010 | Hofer et al. |
| 2004/0032958 A1 | | 2/2004 | Park |
| 2005/0185801 A1 | | 8/2005 | McCarty et al. |
| 2006/0109134 A1 | | 5/2006 | Aisa |
| 2007/0229215 A1 | | 10/2007 | Jha |
| 2008/0106885 A1 | | 5/2008 | Arie et al. |

OTHER PUBLICATIONS

Non Final Office Action from U.S. Appl. No. 11/554,886 mailed Apr. 14, 2011.
Notice of Allowance for U.S. Appl. No. 11/557,951 mailed Apr. 11, 2011.
Non-Final Office Action from U.S. Appl. No. 11/554,886 mailed Apr. 1, 2010.
"BeoCenter 2 User Guide;", Band & Olufsen website; http://www.bang-olufsen.com/beocenter2; downloaded Aug. 13, 2009; 44 pages.

(Continued)

*Primary Examiner* — Alexander Gilman
(74) *Attorney, Agent, or Firm* — Fitch, Even, Tabin & Flannery

(57) ABSTRACT

A bracket or support bar system is for installing one or more audio-visual ("A/V") components or modules and generally overcomes the need for external cables and wiring connections. Every A/V component of the A/V system is attached to a wall bracket or support bar that enables the transfer of power signals and control signals (including media data) to each of the A/V components.

20 Claims, 5 Drawing Sheets

OTHER PUBLICATIONS

Huang Wenwei et al.; Benq Corp. (CN); Audio-Visual Broadcasting Displaying Device With Media Access Assembly Separation; Chinese Patent Publication; Sep. 22, 2004, Pub. No. CN1530959.

Michinori et al.; Matsushita Electric Ind Co. Ltd.; Information Wall Socket;Japanese Patent Abstract; Oct. 6, 2000; Pub. No. 2000-278292.

Hiroshi et al.; Onkyo Corp.; Wiring Rail and Audiovisual System Using the Same;Japanese Patent Abstract; Feb. 21, 2003; Pub. No. 2003-051687.

Hiroyuki et al.; Matsushita Electric Works Ltd.; AV Plug Socket; Japanese Patent Abstract; Mar. 4, 1994; Pub. No. 06-060950.

Isamu Arie, U.S. Appl. No. 11/557,951, filed Nov. 8, 2006.

Notice of Allowance for U.S. Appl. No. 11/557,951 mailed Feb. 3, 2011.

Final Office Action from U.S. Appl. No. 11/554,886 mailed Sep. 28, 2010.

Non Final Office Action from U.S. Appl. No. 11/557,951 mailed Sep. 29, 2010.

Arie et al.; U.S. Appl. No. 13/195,236, filed Aug. 1, 2011.

Final Office Action from U.S. Appl. No. 11/554,886 mailed Aug. 16, 2011.

* cited by examiner

001
APPARATUS AND METHOD FOR MOUNTING AUDIO-VISUAL COMPONENTS

CROSS REFERENCE TO RELATED APPLICATIONS

This application is related to U.S. application Ser. No. 11/557,951, entitled "Movable Audio-Visual Component System and Method," filed Nov. 8, 2006, which such application is incorporated herein by reference.

FIELD OF INVENTION

This relates to audio-visual entertainment systems, and more particularly, to apparatuses and methods for installing and interconnecting entertainment system components.

BACKGROUND

Many popular audio-visual ("A/V") entertainment systems are comprised of separate modules or components, such as for example, audio speakers, hard disk drive recorders, LCD display screens, optical disk players (e.g., CD players or DVD players), controllers, tuners and video projectors, etc. These A/V components typically are interconnected by wires or cables. Frequently, however, these components require differing connection standards and cables, thus making assembly of these systems quite complex.

Moreover, many known A/V components are box-shaped with user controls disposed on the front surface or top surface, and have a myriad of cables extending from the components. Such an assembly frequently does not have an aesthetically-pleasing appearance, thus motivating some users to purchase expensive cabinetry or other furniture in which to place the A/V components and cables out of view.

Once the A/V components are interconnected with the various cables and placed in the cabinetry or other furniture, the components tend to remain statically so placed. It often is too much effort for a user to re-arrange the A/V components or move them into another location within the same room, house, etc., and therefore many users will not expend the effort to re-arrange or move these A/V components, although it may be desirable to do so.

There is a need therefore for an improved A/V component layout and mounting system having an enhanced aesthetic appearance, as well as an ease of assembly, movement and re-arrangement.

SUMMARY OF THE ILLUSTRATED EMBODIMENTS

One embodiment of the invention includes a bracket or support bar system for installing one or more A/V components and which generally overcomes the need for external cables and wiring connections. Every A/V component or module of the A/V system is attached to a wall bracket or support bar that enables the transfer of power signals and control signals (including media data) to each of the A/V components.

In one aspect, a first apparatus is for securing an A/V component to a structure surface, wherein the A/V component has a component first conductive surface. The first apparatus is for use with a second apparatus adapted for attachment to the structure surface. The second apparatus has a second apparatus first electrical bus and a second apparatus first conductive surface electrically connected to the second apparatus first electrical bus.

The first apparatus includes a support bar adapted for attachment to the structure surface and defining a channel adapted to receive the A/V component. A first apparatus first electrical bus is attached to the support bar and is electrically connected to a first apparatus first conductive surface disposed on the support bar. The first apparatus first conductive surface is adapted to abut the component first conductive surface when the A/V component is received by the channel.

A first apparatus second conductive surface is disposed on the support bar and electrically connected to the first apparatus first electrical bus. The first apparatus second conductive surface is adapted to abut the second apparatus first conductive surface when the support bar and the second apparatus are attached to the structure surface adjacent to one another.

Another embodiment of the invention is a method of securing an A/V component to a structure surface. A first support bar is attached to the structure surface, wherein the first support bar defines a first channel. At least a portion of the A/V component is placed into the first channel, wherein the A/V component has an A/V component conductive surface. The first support bar includes a first electrical bus, a first support bar first conductive surface electrically connected to the first electrical bus, and a first support bar second conductive surface electrically connected to the first electrical bus.

The first support bar first conductive surface abuts the A/V component conductive surface when the at least a portion of the A/V component is placed into the first channel. The first support bar is for use with a second support bar having a second electrical bus electrically connected to a second support bar first conductive surface. The first support bar second conductive surface is adapted to abut the second support bar first conductive surface when the first and second support bars are attached to the structure surface adjacent to one another.

There are additional aspects to the present inventions. It should therefore be understood that the preceding is merely a brief summary of some embodiments and aspects of the present inventions. Additional embodiments and aspects are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

These and/or other aspects and advantages of the present invention will become apparent and more readily appreciated from the following description of certain embodiments, taken in conjunction with the accompanying drawings of which:

FIG. 5 is a diagram of a plurality of A/V components according to another embodiment of the invention;

DETAILED DESCRIPTION

Figure 1:
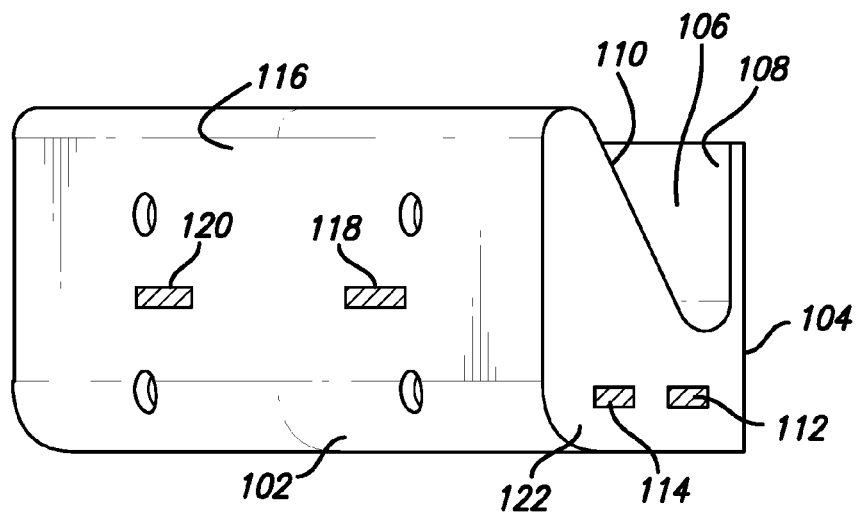
FIG. 1 is a side perspective view of a support bar in accordance with one embodiment of the invention.

The following description is of the best mode presently contemplated for carrying out the invention. Reference will be made in detail to embodiments of the present invention, examples of which are illustrated in the accompanying drawings, wherein like reference numerals refer to like elements throughout. It is understood that other embodiments may be used and structural and operational changes may be made without departing from the scope of the present invention.

Embodiments of the invention generally relate to a bracket or support bar system for installing a system of A/V components and which overcomes the cumbersome network of cables and wiring connections that exist in many known systems. Every A/V component or module of the system is attached to a wall bracket or support bar that enables the transfer of power signals and control signals (including media data) to each of the A/V components. The support bar holds each A/V component via a hook-shaped structure to exchange data and to have access to power.

The support bar can be combined with one or more other support bars to create a long stretch of bars or brackets thus providing an ability to place all of the components onto one combined support bar. Instead of wires, each A/V component carries one or more unique contact or conductive surfaces that abut corresponding surfaces on a support bar in order to receive power and transfer control signals (including media data) among other A/V components. In addition some A/V components, such as speakers, can be wireless. The presence of a hook shaped structure on the rear side of each A/V component facilitates the ability to carry the component from one place to another.

Figure 2:
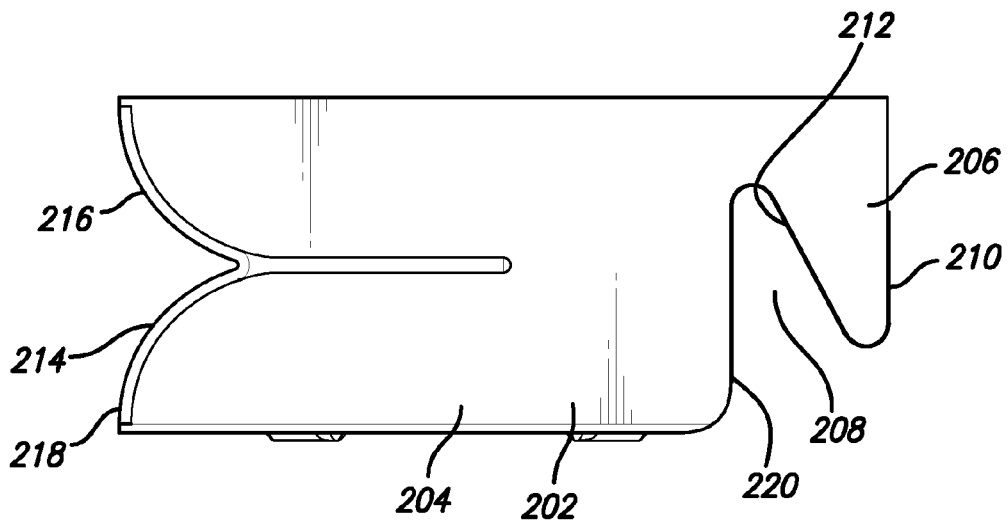
FIG. 2 is a side view of an A/V component in accordance with an embodiment of the invention.
Figure 3:
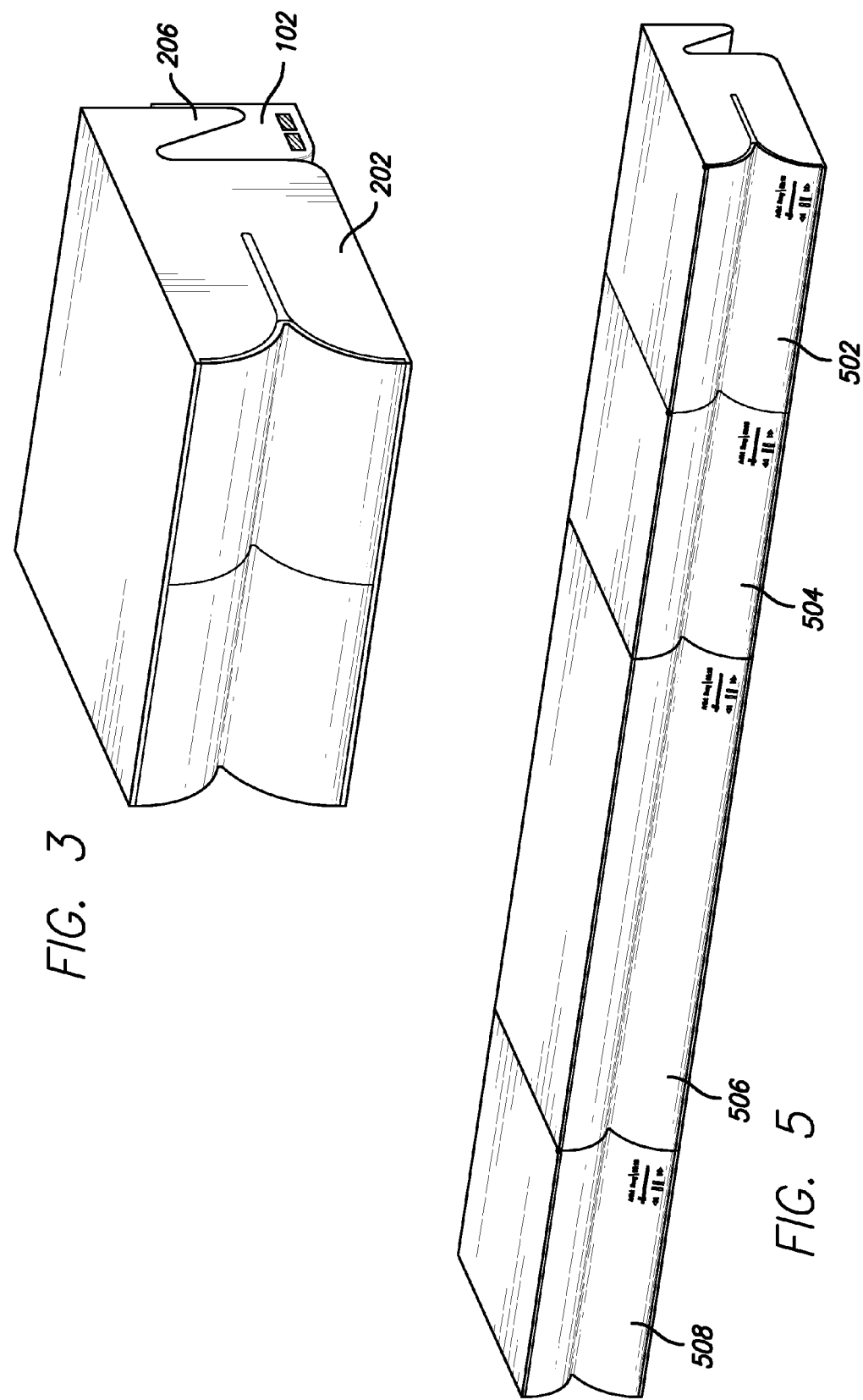
FIG. 3 is a side perspective view of the A/V component of FIG. 2 mounted on the support bar of FIG. 1.

Referring now to FIGS. 1-3, there is shown a support bar 102 for securing an A/V component 202 to a structure surface, such as for example a wall of a dwelling, according to one embodiment of the invention. The A/V component 202 is for using A/V content and can be any electronic component that stores, reproduces, amplifies, produces or otherwise uses the A/V content. Examples include a digital video recorder, a DVD player, an amplifier, a speaker, a television or radio tuner, an LCD display (for television or video viewing, etc.), an A/V controller, a CD player, etc.

In the illustrated embodiment, the support bar 102 is about four inches in height and thus is easily held by one hand of a user. The support bar 102 can be attached directly to the structure surface, and thus has a support bar distal surface 104 adapted to abut the structure surface. The support bar 102 further has a support bar proximate surface 116 that is opposite to and generally parallel with the distal surface 104, and two sidewalls 122 (i.e., one on each end of the support bar 102) connecting the proximate surface 116 with the distal surface 104. The support bar 102 defines a channel 106 that is disposed between the proximate and distal surfaces 104, 116 and that extends down the support bar 102 in a generally longitudinal direction and has a generally V-shaped cross-section. The channel 106 is further defined by a channel distal surface 108 that is generally parallel to the support bar distal surface 104 and a channel proximate surface 110 that tapers away from the channel distal surface 108 as the channel proximate surface 110 extends upwardly.

The support bar 102 further includes first and second conductive surfaces 118, 120 disposed on the support bar proximate surface 116, third and fourth conductive surfaces 112, 114 disposed on one sidewall 122, and fifth and sixth conductive surfaces (not shown in FIG. 1) disposed on the opposite sidewall 122 (not shown). These conductive surfaces will be described in further detail below.

In the illustrated embodiment, the A/V component 202 is about four inches in height and thus is easily held by one hand of a user. As best seen in FIG. 2, the A/V component 202 includes a housing 204 having a front face 214 and a rear face 210. The front face 214 has a concave shape formed by an upper face surface 216 and a lower face surface 218, wherein each front face surface 216, 218 has cross section that defines an approximately 90-degree arc of an imaginary circle.

The A/V component housing 204 further has a hook-shaped portion 206 adapted to mate in an interlocking fashion with the support bar channel 106 as best seen in FIG. 3. The housing rear face 210 forms one wall of the hook-shaped portion 206 and is generally parallel with the support bar channel distal surface 108 and therefore abuts the channel distal surface 108 when the A/V component 202 is mated with the support bar 102. Another wall of the hook-shaped housing portion 206 is formed by a housing channel first surface 212 that is disposed between housing front face 214 and the housing rear face 210 and that tapers away from the housing rear face 210 as the channel first surface 212 extends upwardly. A housing channel second surface 220 is disposed between the housing front face 214 and the housing channel first surface 212. The housing channel second surface 220 is generally parallel with the housing rear face 210, and along with the housing channel first surface 212, defines a housing channel 208 having a generally V-shaped cross section and extending the width of the A/V component 202. The A/V component 202 further includes two conductive surfaces (not shown in FIG. 2) disposed on the housing channel second surface 220, the operation of which will be described further below. These A/V component conductive surfaces are positioned so that they abut the support bar first and second conductive surfaces 118, 120 when the A/V component 202 is mated with the support bar 102.

When the support bar 102 is attached to the structure surface, the configuration of the A/V component housing 204 allows the A/V component 202 to be quickly and easily mounted on and supported by the support bar 102 and without the use of any other clips, bolts, screws or other external fastening devices, and without the need for external cables running between the A/V component and the support bar.

Figure 4:
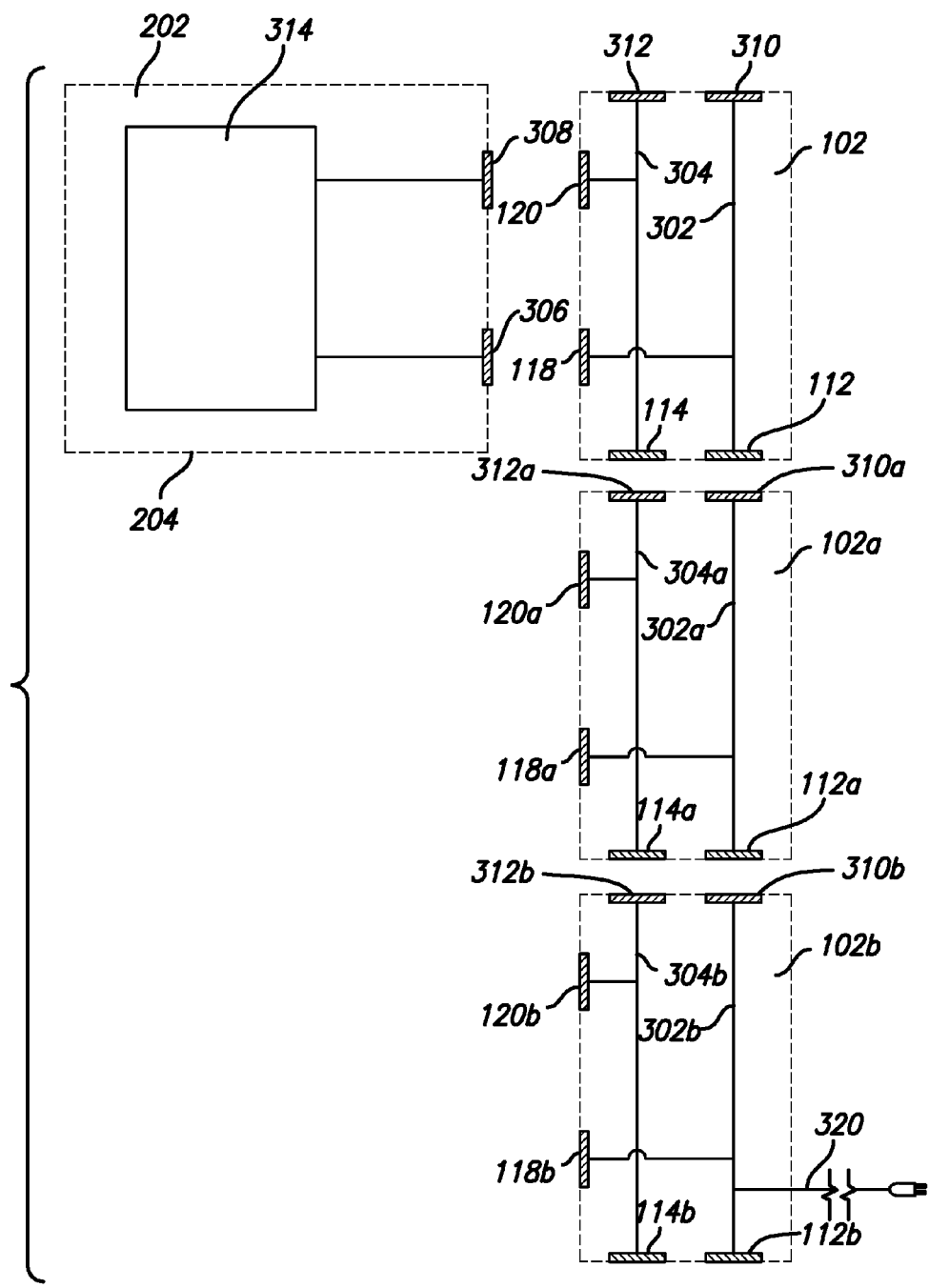
FIG. 4 is a functional block diagram of electrical components according to an embodiment of the invention.

FIG. 4 is a functional block diagram of certain electrical components of the A/V component 202, the support bar 102 and of a plurality of additional support bars, according to an embodiment of the invention. Referring to FIG. 4, shown is the support bar 102 of FIG. 1, as well as two other support bars 102a, 102b having essentially the same construction. Also shown is the A/V component 202 of FIG. 2. Enclosed within the support bar 102 are a first electrical bus 302 for transmitting a power signal for use by the A/V component 202 and a second electrical bus 304 for transmitting a control signal for use by the A/V component 202 in controlling the use of A/V content or for transmitting A/V content data.

The first bus 302 is connected to the first conductive surface 118 disposed on the support bar proximate surface 116 (FIG. 1). Similarly, the second bus 304 is connected to the second conductive surface 120 also disposed on the support bar proximate surface 116. In order to make an electrical connection when the A/V component 202 is received by the support bar channel 106, the support bar first and second conductive surfaces 118, 120 are oriented so that they abut or contact an A/V component first conductive surface 306 and second conductive surface 308, respectively, disposed on the A/V component channel second surface 220 (FIG. 2). Enclosed within the A/V component housing 204 is electronic circuitry 314 that is electrically connected to the A/V component first and second conductive surfaces 306, 308 and that is for processing control signals or data for using the A/V content.

Rather than being enclosed within the support bar 102, in other embodiments the first and second electrical buses 302, 304 are disposed on the surface of the support bar 102 or embedded within the material forming the support bar 102. Also, in alternative embodiments, the first and second support bar conductive surfaces 118, 120 are disposed on the support bar channel proximate surface 110 or the channel distal surface 108, and therefore the corresponding A/V component first and second conductive surfaces 306, 308 are disposed on the A/V component channel first surface 212 or the A/V component rear face 210, as necessary to make electrical connections.

Still referring to FIG. 4, also electrically connected to the first and second electrical buses 302, 304 are, respectively, support bar third and fourth conductive surfaces 112, 114 disposed on the surface of one of the support bar sidewalls 122 (FIG. 1), and fifth and sixth conductive surfaces 310, 312 disposed on the surface of the opposite support bar sidewall. These third, fourth, fifth and sixth conductive surfaces 112, 114, 310, 312 are configured to abut or contact corresponding conductive surfaces on the sidewalls of other support bars, such as the support bars designated by reference numerals 102a, 103b in FIG. 4, when two or more support bars are attached to the structure surface adjacent to one another, thereby effectively extending the first and second electrical buses 302, 304 to the other support bars 102a, 102b. In the embodiment of FIG. 4 only one support bar, i.e. the support bar designated by reference numeral 102b, has an external power cable 320 for connecting an external power source to the first electrical bus 302b, since the first electrical bus 302b can supply the remaining first electrical buses 302, 302a of the other support bars 102, 102a. Thus only a single power cable is needed for the entire system.

While the illustrated conductive surfaces described above are generally rectangular in shape, in alternative embodiments, they can take various forms and encompass various dimensions and geometries. According to one embodiment, the conductive surfaces on each support bar and A/V component housing comprise electrical contacts that have springs or other elements to ensure that the contacts protrude out beyond the surface of each support bar and A/V component housing to which the contacts are affixed. When a support bar is moved to an adjacent support bar or is interlocked with an A/V component, the contacts from one device physically touches the contacts from the other device, and the contacts retract slightly from their outward positions. This ensures that the contacts touch each other so that the power and control signals may be transferred between the support bars and between the support bars and the A/V components. In other embodiments however, spring-like elements are not required and the contacts do not extend beyond the surfaces of the support bars and A/V component housings.

While the illustrated embodiment shows two electrical buses, i.e., one for a power signal and one for a control signal, alternative embodiments can employ a greater number of buses, or alternatively, only one electrical bus that supplies both the power and control signals, such as via a power line communications ("PLC") network.

Thus it can be appreciated that by using two or more support bars with the same general design, such as the support bars designated by reference numerals 102, 102a, 102b in FIG. 4, a user can attach them to a support surface adjacent to one another thereby effectively forming a continuous ledge having a continuous channel, such as the channel 106 of FIG. 1, and effectively having two continuous electrical buses. For a uniform and aesthetically-pleasing appearance, the support bars have generally the same appearance, so that each support bar has a cross-section profile that is generally the same as that of the other support bars. Similarly, the A/V components have generally the same appearance, so that each A/V component has a cross-section profile that is generally the same as that of the other A/V components.

FIG. 5 shows a plurality of A/V components 502, 504, 506, 508 disposed adjacent to one another. Although each A/V component has a generally different function, they have the same general appearance, so that each has a cross-section profile that is generally the same as that of the other. This provides an aesthetically-pleasing appearance with no visible, external cables running between the A/V components 502, 504, 506, 508 or running from the A/V components 502, 504, 506, 508 to the support bars. Moreover, with this arrangement the A/V components 502, 504, 506, 508 can be operationally mated with the channels of any of the support bars so that the components are supported by the support bars and electrically connected to each other and to a power supply via the electrical buses. Advantageously, the A/V components can be interchangeably mated with the support bars, so that they can be quickly and easily re-arranged on the support bars in any order by the user while retaining their operability and without the use of external cables or additional fastening devices.

Thus it can be seen that by this arrangement, the A/V components receive power and control signals (including A/V content data) via the support bars and electrical buses housed within. Specifically, any two or more support bars transmit the control signal and the power signal between one another when they are attached to the structure surface and disposed adjacent to one another. Regardless of whether an A/V component is mounted on a first or second support bar, the A/V component can receive the control signal and power signal via the support bars due to the uniformity of placement of conductive surfaces on both the A/V component and the support bars.

Figure 6:
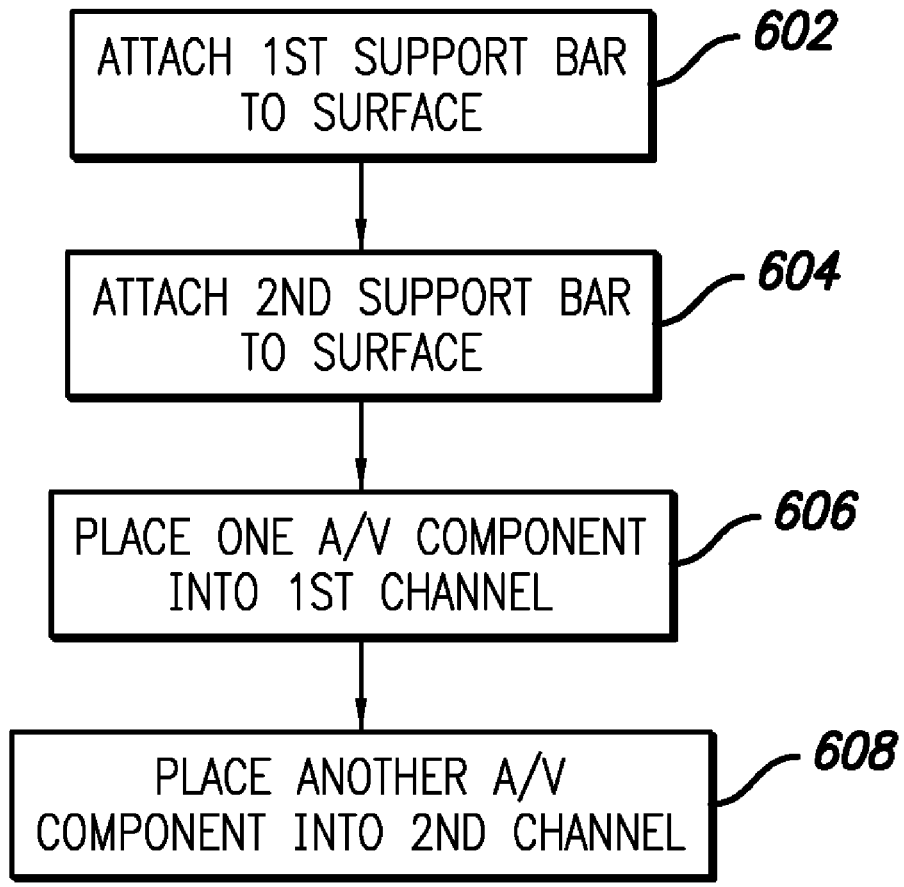
FIG. 6 is a simplified process flow diagram for a method of securing A/V components to a structure surface according to an embodiment of the invention.

FIG. 6 illustrates a method of securing A/V components to a structure surface according to an embodiment of the invention. First, a first support bar defining a first channel is attached to the structure surface. (Step 602) Next, a second support bar defining a second channel is attached to the structure surface at a location adjacent to the first support bar so that the second support bar abuts the first support bar. (Step 604) The first and second support bars each have two conductive surfaces configured so that the two conductive surfaces of the first support bar abut or contact the two conductive surfaces of the second support bar when the support bars are mounted on the structure surface adjacent to one another.

A portion of one A/V component having two conductive surfaces is placed into the first support bar first channel, so that these two conductive surfaces contact or abut a third and fourth conductive surface, respectively, on the first support bar. (Step 606) Similarly, a portion of another A/V component having two conductive surfaces is placed into the second support bar second channel, so that these two conductive surfaces contact or abut a third and fourth conductive surface, respectively, on the second support bar. (Step 608)

Figure 7:
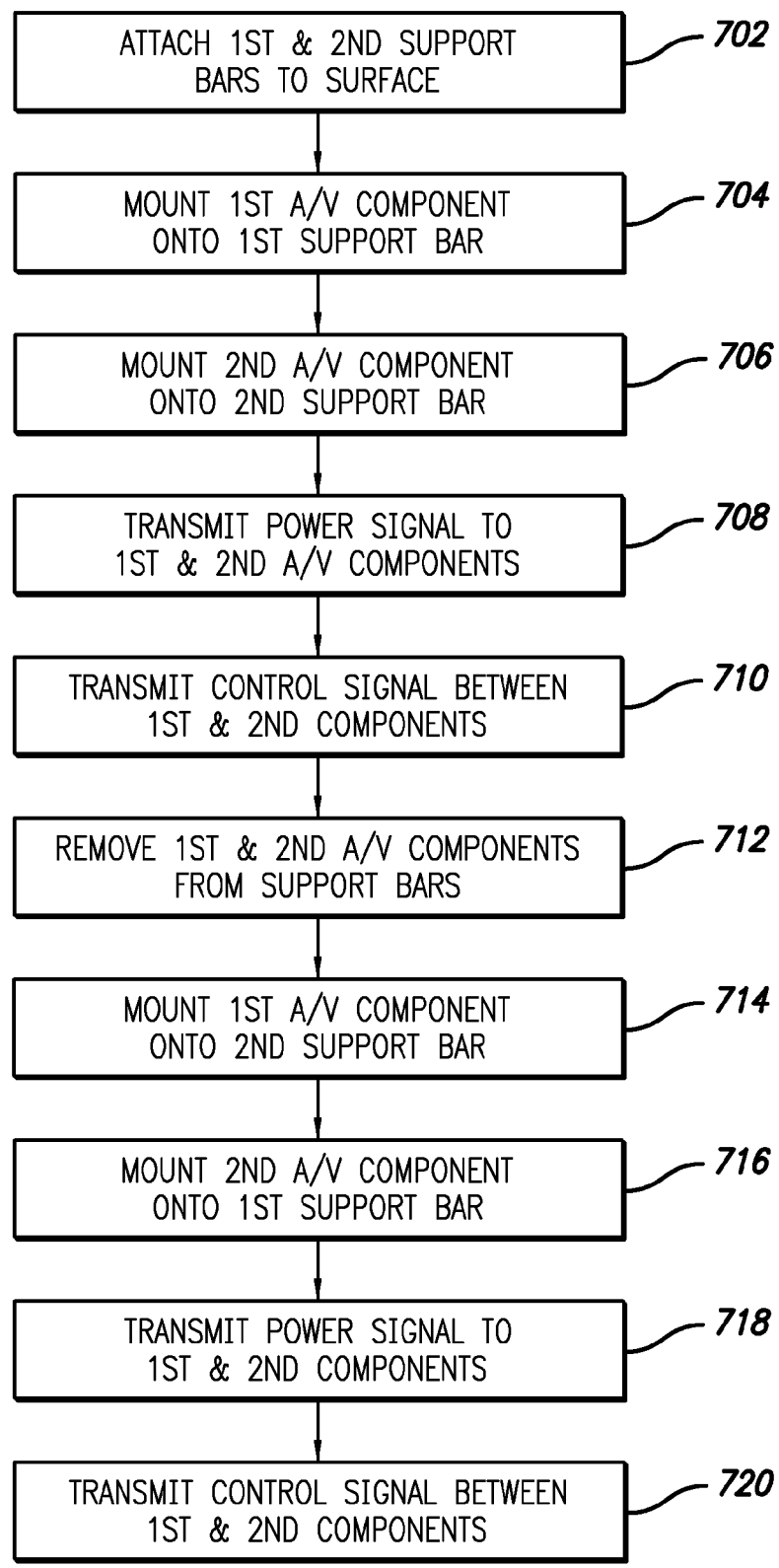
FIG. 7 is a simplified process flow diagram for a method of moving and operating A/V components according to an embodiment of the invention.

FIG. 7 illustrates a method of moving and operating A/V components according to an embodiment of the invention. First and second support bars are each attached to a structure surface, such as a wall, wherein each of the support bars defines a support bar channel. (Step 702) Next, a first A/V component is mounted onto the first support bar (Step 704), and a second A/V component is mounted on the second support bar (Step 706), wherein each of the A/V components has a hook-shaped portion adapted to mate with the support bar channel of either of the support bars. A power signal is transmitted to the first and second A/V components via the first and second support bars. (Step 708) Next, a control signal is transmitted between the first A/V component and the second A/V component via the first and second support bars. (Step 710)

In order to re-arrange the A/V components, the first and second A/V components are removed from the first and second support bars. (Step 712) Then the first A/V component is mounted on the second support bar (Step 714) and the second A/V component is mounted on the first support bar (Step 716). The power signal is again transmitted to the first and second A/V components via the support bars (Step 718). Finally, a control signal (including A/V content data) is transmitted between the first A/V component and the second A/V component via the support bars. (Step 720)

Thus it can be seen that embodiments of the invention permit A/V components to receive power and transmit control signals (including A/V content data) via the support bars and electrical buses housed within. Any two or more support bars transmit the control signal and the power signal between one another when they are attached to a structure surface adjacent to one another. Regardless of whether an A/V component is mounted on a first or second support bar, the A/V component can receive the control signal and power signal via the support bars due to the uniformity of placement of conductive surfaces on both the A/V component and the support bars. This provides easy system expandability by simply attaching additional support bars adjacent to existing support bars and adding additional A/V components as desired.

This ease of expandability includes the sales of these items by a manufacturer. Each A/V component can be sold with a support bar bundled with the A/V component and having a width dimension that matches the width of the A/V component. Thus a consumer does not need to worry about locating and purchasing a support bar separately, thereby making it easy for the consumer to have ready access to the parts necessary for expansion and use of an A/V system.

Advantages of embodiments of the invention include the use of A/V components in more than one room. For example, support bars can be mounted in more than one room or location, and certain of the A/V components can easily be carried from room to room and mounted on a support bar as needed. The A/V components can include one or more speakers that are adapted to receive A/V content data both via a bus in a support bar or wirelessly. Thus a user can carry the speakers from one room where the other A/V components are mounted to another room where only the speakers are used. The speakers can wirelessly receive the A/V content data and play the A/V content for the user while in the other room. In yet an alternative embodiment, the speakers could receive the A/V content data in the other room via a power line communications (PLC) network.

Further advantages include the use of the support bars with a home server. An external cable can be used to connect a home server with a data bus located within a support bar. (Alternatively, a PLC network or a wireless connection may be used.) Once connected to the data bus of one support bar, all A/V components would thereby have a data connection to the server.

While the description above refers to particular embodiments of the present invention, it will be understood that many modifications may be made without departing from the spirit thereof. The claims are intended to cover such modifications as would fall within the true scope and spirit of the present invention. The presently disclosed embodiments are therefore to be considered in all respects as illustrative and not restrictive, the scope of the invention being indicated by the claims rather than the foregoing description, and all changes which come within the meaning and range of equivalency of the claims are therefore intended to be embraced therein.

What is claimed is:

1. A first apparatus for securing an audio-visual ("A/V") component housing to a structure surface, wherein the A/V component housing encloses electronic circuitry for processing control signals or data for using A/V content, wherein the A/V component housing has a component first conductive surface, wherein the first apparatus is for use with a second apparatus adapted for attachment to the structure surface, wherein the second apparatus has a second apparatus first electrical bus and a second apparatus first conductive surface electrically connected to the second apparatus first electrical bus, the first apparatus comprising:
   a support bar adapted for attachment to the structure surface and defining a channel adapted to receive the A/V component housing,
   wherein the support bar is configured to support the A/V component housing and to secure the A/V component housing to the structure surface when the A/V component housing is received by the channel;
   a first apparatus first electrical bus attached to the support bar;
   a first apparatus first conductive surface disposed on the support bar and electrically connected to the first apparatus first electrical bus, wherein the first apparatus first conductive surface is adapted to abut the component first conductive surface when the A/V component housing is received by the channel; and
   a first apparatus second conductive surface disposed on the support bar and electrically connected to the first apparatus first electrical bus, wherein the first apparatus second conductive surface is adapted to abut the second apparatus first conductive surface when the support bar and the second apparatus are attached to the structure surface adjacent to one another.

2. The first apparatus of claim 1 wherein the first apparatus first electrical bus is for a power line communications ("PLC") network.

3. The first apparatus of claim 1 wherein the A/V component housing is a first A/V component housing, wherein the first apparatus is further for securing a second A/V component housing to the structure surface when the first A/V component housing is not secured to the structure surface by the first apparatus, wherein the second A/V component housing encloses electronic circuitry for processing control signals or data for using A/V content, wherein the channel of the support bar is adapted to receive the second A/V component housing when the first A/V component housing is not received by the channel, and wherein the electronic circuitry in the first A/V component housing is adapted to perform a generally different function than the electronic circuitry in the second A/V component housing.

4. The first apparatus of claim 3 wherein the electronic circuitry enclosed in the first A/V component housing is for a first one of a digital video recorder, a DVD player, an amplifier, a speaker, a television tuner, an A/V controller, and a CD player, and wherein the electronic circuitry enclosed in the second A/V component housing is for a second one of the digital video recorder, the DVD player, the amplifier, the speaker, the television tuner, the A/V controller, and the CD player.

5. The first apparatus of claim 1 wherein the channel defined by the support bar extends in a generally longitudinal direction and has a generally V-shaped cross-section.

6. The first apparatus of claim 1 wherein the support bar has a distal support bar surface adapted to abut the structure surface when the support bar is attached to the structure surface, wherein the channel is defined by a distal channel surface and a proximate channel surface, wherein the distal channel surface is generally parallel to the distal support bar surface, and wherein the proximate channel surface tapers away from the distal channel surface.

7. The first apparatus of claim 1 wherein the A/V component housing has a component second conductive surface, wherein the second apparatus has a second apparatus second electrical bus and a second apparatus second conductive surface electrically connected to the second apparatus second electrical bus, the first apparatus further comprising:
  a first apparatus second electrical bus attached to the support bar;
  a first apparatus third conductive surface disposed on the support bar and electrically connected to the first apparatus second electrical bus, wherein the first apparatus third conductive surface is adapted to abut the component second conductive surface when the A/V component housing is received by the channel; and
  a first apparatus fourth conductive surface disposed on the support bar and electrically connected to the first apparatus second electrical bus, wherein the first apparatus fourth conductive surface is adapted to abut the second apparatus second conductive surface when the support bar and the second apparatus are attached to the structure surface adjacent to one another.

8. The first apparatus of claim 7, wherein the first apparatus first electrical bus is for transmitting a power signal and the first apparatus second electrical bus is for transmitting a control signal.

9. A system for securing a plurality of audio-visual ("A/V") component housings to a structure surface, wherein each of the plurality of A/V component housings encloses electronic circuitry for processing control signals or data for using A/V content, wherein the plurality of A/V component housings has a plurality of component first conductive surfaces, the system comprising:
  a plurality of support bars adapted for attachment to the structure surface, wherein the plurality of support bars defines a plurality of channels adapted to receive the plurality of A/V component housings,
  wherein the plurality of support bars is configured to support the plurality of A/V component housings and to secure the plurality of A/V component housings to the structure surface when the plurality of A/V component housings is received by the plurality of channels;
  a plurality of first electrical buses attached to the plurality of support bars;
  a plurality of support bar first conductive surfaces disposed on the plurality of support bars and electrically connected to the plurality of first electrical buses, wherein the plurality of support bar first conductive surfaces is adapted to abut the plurality of component first conductive surfaces when the plurality of A/V component housings is received by the plurality of channels; and
  a plurality of support bar second conductive surfaces disposed on the plurality of support bars and electrically connected to the plurality of first electrical buses, wherein one of the plurality of support bar second conductive surfaces is adapted to abut another one of the plurality of support bar second conductive surfaces when one of the plurality of support bars is attached to the structure surface adjacent to another one of the plurality of support bars.

10. The system of claim 9 wherein each of the plurality of support bars has a cross-section profile, and wherein the cross section profile of any one of the plurality of support bars is generally the same as the cross-section profile of any other one of the plurality of support bars.

11. The system of claim 9 wherein the plurality of support bars is interchangeable with the plurality of A/V component housings so that any one of the plurality of channels is adapted to operatively receive any one of the plurality of A/V component housings, and wherein the electronic circuitry in each of the plurality of A/V component housings is adapted to perform a generally different function than the electronic circuitry in any other of the plurality of A/V component housings.

12. The system of claim 9 wherein the plurality of A/V component housings has a plurality of component second conductive surfaces, the system further comprising:
  a plurality of second electrical buses attached to the plurality of support bars;
  a plurality of support bar third conductive surfaces disposed on the plurality of support bars and electrically connected to the plurality of second electrical buses, wherein the plurality of support bar third conductive surfaces is adapted to abut the plurality of component second conductive surfaces when the plurality of A/V component housings is received by the plurality of channels; and
  a plurality of support bar fourth conductive surfaces disposed on the support bar and electrically connected to the plurality of second electrical buses, wherein one of the plurality of support bar fourth conductive surfaces is adapted to abut another one of the plurality of support bar fourth conductive surfaces when the one of the plurality of support bars is attached to the structure surface adjacent to the other one of the plurality of support bars.

13. The system of claim 12 wherein each of the plurality of support bars has a cross-section profile, and wherein the cross section profile of any one of the plurality of support bars is generally the same as the cross-section profile of any other one of the plurality of support bars.

14. The system of claim 12 wherein the plurality of support bars is interchangeable with the plurality of A/V component housings so that any one of the plurality of channels is adapted to operatively receive any one of the plurality of A/V component housings, and wherein the electronic circuitry in each of the plurality of A/V component housings is adapted to perform a generally different function than the electronic circuitry in any other of the plurality of A/V component housings.

15. A method of securing an audio-visual ("A/V") component housing to a structure surface, the method comprising:
  attaching a first support bar to the structure surface, wherein the first support bar defines a first channel; and
  placing at least a portion of the A/V component housing into the first channel, wherein the A/V component housing encloses electronic circuitry for processing control signals or data for using A/V content, wherein the A/V component housing has an A/V component conductive surface,
  wherein the first support bar supports the A/V component housing and secures the A/V component housing to the structure surface when the at least the portion of the A/V component housing is placed into the first channel;

wherein the first support bar includes a first electrical bus, a first support bar first conductive surface electrically connected to the first electrical bus, and a first support bar second conductive surface electrically connected to the first electrical bus;

wherein the first support bar first conductive surface abuts the A/V component conductive surface when the at least a portion of the A/V component housing is placed into the first channel;

wherein the first support bar is for use with a second support bar having a second electrical bus electrically connected to a second support bar first conductive surface; and wherein the first support bar second conductive surface is adapted to abut the second support bar first conductive surface when the first and second support bars are attached to the structure surface adjacent to one another.

16. The method of claim 15, wherein the A/V component housing is a first A/V component housing, and wherein the method is further for securing a second A/V component housing to the structure surface, the method further comprising:

attaching the second support bar to the structure surface at a location adjacent to the first support bar so that the second support bar abuts the first support bar, wherein the second support bar defines a second channel; and placing at least a portion of the second A/V component housing into the second channel, wherein the second A/V component housing encloses electronic circuitry for processing control signals or data for using A/V content and wherein the second A/V component housing has a second A/V component conductive surface;

wherein the second support bar further includes a second support bar second conductive surface electrically connected to the second electrical bus; and wherein the second support bar second conductive surface abuts the second A/V component conductive surface when the at least a portion of the second A/V component housing is placed into the second channel.

17. The method of claim 16 wherein the first electrical bus and the second electrical bus are for a power line communications ("PLC") network.

18. The method of claim 16 wherein the electronic circuitry enclosed in the first A/V component housing is for a first one of a digital video recorder, a DVD player, an amplifier, a speaker, a television tuner, an A/V controller, and a CD player, and wherein the electronic circuitry enclosed in the second A/V component housing is for a second one of the digital video recorder, the DVD player, the amplifier, the speaker, the television tuner, the A/V controller, and the CD player.

19. The method of claim 16 wherein the first and second channels each extends in a generally longitudinal direction and has a generally V-shaped cross-section.

20. The method of claim 16 wherein the first support bar and the second support bar each has a distal support bar surface abutting the structure surface when each of the first and second support bars is attached to the structure surface, wherein each of the first and second channels is defined by a distal channel surface and a proximate channel surface, wherein the distal channel surface is generally parallel to the distal support bar surface, and wherein the proximate channel surface tapers away from the distal channel surface.

* * * * *